United States Patent
Hiyama

(10) Patent No.: US 8,293,563 B2
(45) Date of Patent: Oct. 23, 2012

(54) METHOD FOR MANUFACTURING SEMICONDUCTOR DEVICE

(75) Inventor: Susumu Hiyama, Kumamoto (JP)

(73) Assignee: Sony Corporation, Tokyo (JP)

( * ) Notice: Subject to any disclaimer, the term of this patent is extended or adjusted under 35 U.S.C. 154(b) by 37 days.

(21) Appl. No.: 12/775,037

(22) Filed: May 6, 2010

(65) Prior Publication Data

US 2010/0304520 A1  Dec. 2, 2010

(30) Foreign Application Priority Data

May 28, 2009  (JP) .................................. 2009-128438

(51) Int. Cl.
*H01L 31/042* (2006.01)

(52) U.S. Cl. ............ 438/69; 438/73; 438/785; 438/795; 257/E31.122

(58) Field of Classification Search .................... 438/60, 438/75, 795, 69, 73, 785; 257/E31.122
See application file for complete search history.

(56) References Cited

U.S. PATENT DOCUMENTS

| | | | |
|---|---|---|---|
| 7,436,012 B2 * | 10/2008 | Mori et al. | 257/292 |
| 7,834,412 B2 * | 11/2010 | Ando | 257/461 |
| 2011/0175187 A1 * | 7/2011 | Ueno et al. | 257/437 |

FOREIGN PATENT DOCUMENTS

JP  2007-258684  10/2007

* cited by examiner

*Primary Examiner* — Mary Wilczewski
*Assistant Examiner* — Toniae Thomas
(74) *Attorney, Agent, or Firm* — SNR Denton US LLP

(57) ABSTRACT

Disclosed herein is a method for making a semiconductor device including the steps of: forming a light-receiving portion for carrying out photoelectric conversion in a semiconductor substrate; forming an insulating film to cover a light-receiving side of the semiconductor substrate; forming a metallic light-shielding film to partly cover the insulating film in correspondence to the light-receiving portion; and heating the metallic light-shielding film by irradiation of the metallic light-shielding film with a microwave to permit selective annealing of a laminated portion with the metallic light-shielding film in the insulating film.

21 Claims, 4 Drawing Sheets

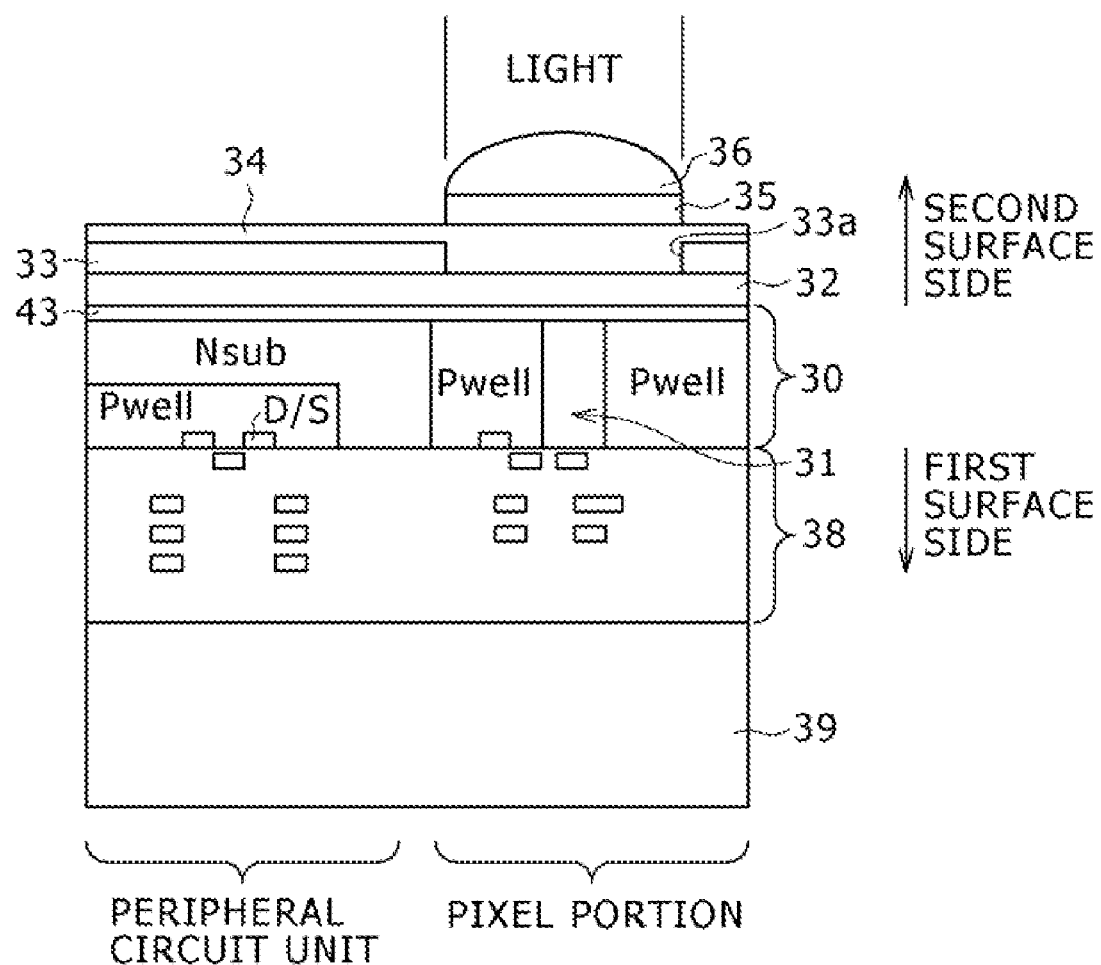

METHOD FOR MANUFACTURING SEMICONDUCTOR DEVICE

BACKGROUND OF THE INVENTION

1. Field of the Invention

This invention relates to a method for making a semiconductor device and more particularly, to a method for making a semiconductor device adapted for use in the manufacture of solid-state image sensing devices of a backside illumination type.

2. Description of the Related Art

In recent years, solid-state image sensing devices, such as CCD (charge coupled device) image sensors, CMOS (complementary metal oxide semiconductor) image sensors and the like, have been mounted in and used for a variety of electronic apparatus.

The solid-state image sensing device, e.g. a CMOS image sensor, is composed of a photodiode wherein individual pixels are formed on a silicon substrate, and an on-chip lens for focusing light thereon. When incident light arrives at the photodiode through the on-chip lens, photoelectric conversion occurs to output a voltage value, thereby enabling light to be taken out as an electric signal.

With CMOS image sensors of a general construction, there are formed between the on-chip lens and the photodiode a transistor used for the input and output of a voltage, a wiring layer and the like in a multilayered fashion. This may lead to concern that incident light impinges on the wiring layer in the course of a light path and bounces off, or is turned owing to the inflection occurring at the interface with an interlayer film of the wiring layer, so that light focused with the on-chip lens cannot be efficiently arrived at the photodiode.

For this reason, there has been proposed adoption of a pixel structure of a so-called backside illumination type wherein incident light is illuminated from the backside of a silicon substrate to allow efficient arrival at the photodiode, unlike the above-stated pixel structure of the general construction (see Japanese Patent Laid-open No. 2007-258684).

FIG. 6 is a schematic view illustrating an example of a pixel structure of a CMOS image sensor of a backside illumination type. As shown in the figure, with the pixel structure of the backside illumination type, a wiring layer, not shown, is formed at one surface side (i.e. a lower side as viewed in the figure) of a silicon substrate 50 having a photodiode 51 formed therein. At the other side (i.e. an upper side as viewed in the figure) of the silicon substrate 50, a light-shielding film 53 is formed through a high-dielectric constant (high-K) insulating film 52 such as a hafnium oxide ($HfO_2$) film, a silicon oxide ($SiO_2$) film or the like. This light-shielding film 53 is so partly formed as to allow light to be passed to the photodiode 51 while shielding light at the other portions. An on-chip lens 56 is formed through a protective film 54 for planarization at a more incident side (i.e. a more upper side as viewed in the figure) of light than the light-shielding film 53. With this backside illumination type of pixel structure, light is illuminated from the back side (i.e. the upper side as viewed in the figure) of the silicon substrate 50, so that a quantity of the light entering the unit pixel is increased without undergoing an influence of the wiring and transistor, and a lowering in sensitivity relative to the change in incident angle of light can be suppressed.

SUMMARY OF THE INVENTION

However, when comparing the pixel structure of the backside structure type with those of an ordinarily constructed surface illumination type, it has been empirically known that a dark current increases at a portion covered with and beneath the light-shielding film 53. Such an increase of dark current leads to a lowering of image quality as a result of image sensing and thus has to be suppressed.

For the reduction of the dark current, it occurs to one that hydrogen sintering is carried out after formation of the light-shielding film 53. The hydrogen sintering is a procedure wherein thermal treatment is conducted in an atmosphere containing hydrogen. This inactivates an impurity level that is a factor of causing the dark current. However, if the hydrogen sintering is carried out, the light-shielding film 53 undergoes an unsatisfactory degree of pinning at a portion therebeneath and thus it is not always possible to permit the reduction of dark current. In order to realize the reduction, it is known effective to carry out higher-temperature sintering. Nevertheless, a difficulty is involved in the realization owing to the limitation by thermal budget (time-integral value of added temperature) over the entire device.

It is accordingly a goal of the invention to provide a method for making a semiconductor device wherein in case where a backside illumination type of pixel structure is adopted, for example, selective annealing of a shielding film-formed portion is enabled thereby contributing to an improvement of dark current at a portion beneath the light-shielding film without surpassing limitation by thermal budget.

In view of above situation, there is provided, according to the embodiment of the invention, a method for making a semiconductor device, which method including the steps of forming a light-receiving portion for carrying out photoelectric conversion in a semiconductor substrate, forming an insulating film to cover a light-receiving side of the semiconductor substrate, forming a metallic light-shielding film to partly cover the insulating film in correspondence to the light-receiving portion, and heating the metallic light-shielding film by irradiation of the metallic light-shielding film with a microwave to permit selective annealing of a laminated portion with the metallic light-shielding film in the insulating film.

In the method for making a semiconductor device including the above steps, a microwave is irradiated on the metallic light-shielding film partly covering the insulating film to heat the metallic light-shielding film. This allows the heat of the metallic light-shielding film to be transmitted by thermal conduction at a portion beneath the metallic light-shielding film, i.e. at a laminated portion with the metallic light-shielding film in the insulating film. In other words, selective annealing of the laminated portion with the metallic light-shielding film in or within the insulating film becomes possible using the metallic light-shielding film as a heat source. This unnecessitates higher heating temperatures in respect of the entire semiconductor device and selective annealing of the portion beneath or below the metallic light-shielding film is carried out thereby realizing pinning reinforcement and an improvement of interfacial characteristics.

Thus, according to the invention, pinning reinforcement and an improvement of interfacial characteristics are ensured by the selective annealing of a portion beneath or below the metallic light-shielding film. Accordingly, even though a pixel structure, for example, of a backside illumination type is adopted, it becomes possible to contribute to an improvement of dark current at a portion beneath the metallic light-shielding film without surpassing limitation by thermal budget relative to the entire semiconductor device.

BRIEF DESCRIPTION OF THE DRAWINGS

FIG. 3 is a sectional view showing a schematic construction example of a pixel structure of a backside illumination type of CMOS image sensor;

DETAILED DESCRIPTION OF THE PREFERRED EMBODIMENTS

Embodiments of the invention are described.
<First Embodiment>
[Construction Example of a Solid-State Image Sensing Device]

Initially, a semiconductor device made according to the method of the embodiment according to the present invention is described, for which a solid-state image sensing device that is a specific example of the semiconductor device is illustrated. For the solid-state image sensing device, illustration is made specifically on a backside illumination type of CMOS image sensor.

Figure 1:
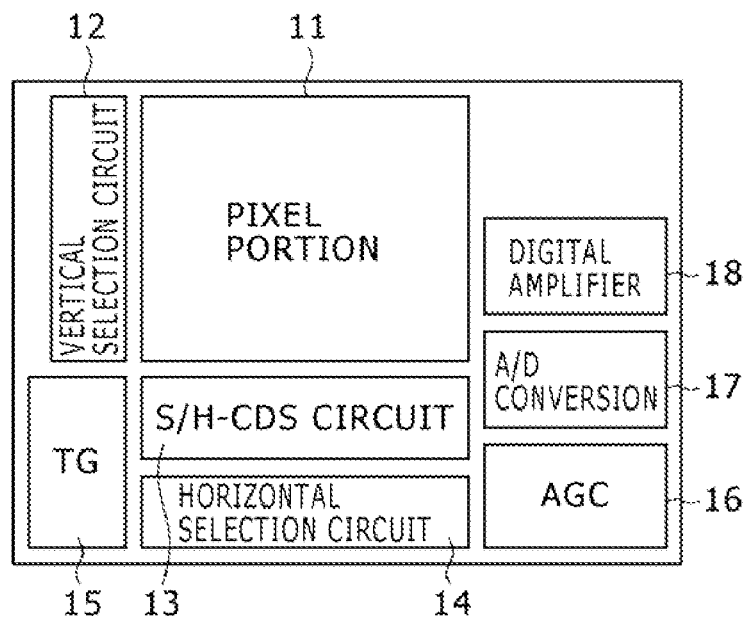
FIG. 1 is a functional block diagram showing a schematic construction example of a CMOS image sensor.

Reference is now made to FIG. 1 that is a functional block diagram showing a schematic construction example of a CMOS image sensor.

As shown in the figure, a CMOS image sensor has a pixel portion 11 and a peripheral circuit portion, which are so arranged as to be mounted on the same semiconductor substrate. In this instance, the peripheral circuit portion has a vertical selection circuit 12, a S/H (sample/hold)-CDS (correlated double sampling) circuit 13, a horizontal selection circuit 14, a timing generator (TG) 15, an AGC (automatic gain control) circuit 16, an A/D conversion circuit 17 and a digital amplifier 18.

The pixel portion 11 has a multitude of unit pixels arranged in matrix as will be described hereinafter, and address lines, etc., are provided for every row unit and signal lines, etc., are provided for every column unit.

The vertical selection circuit 12 successively selects pixels on a row-by-row basis and the signals of the respective pixels are read out through the vertical signal lines to the S/H-CDS circuit 13 on a column-by-column basis.

The S/H-CDS circuit 13 carries out signal processing such as with CDS with respect to the pixel signals read out from the respective pixel columns.

The horizontal selection circuit 14 successively retrieves the pixel signals held in the S/H-CDS circuit 13 and outputs to the AGC circuit 16.

The AGC circuit 16 amplifies the signal from the horizontal selection circuit 14 with an appropriate gain and outputs to the A/D conversion circuit 17.

The A/D conversion circuit 17 converts an analog signal inputted from the AGC circuit 16 to a digital signal and outputs to the digital amplifier 18.

The digital amplifier 18 appropriately amplifies the digital signal from the A/D conversion circuit 17 and outputs from a pad (terminal).

The vertical selection circuit 12, S/H-CDS circuit 13, horizontal selection circuit 14, AGC circuit 16, A/D conversion circuit 17 and digital amplifier 18 are, respectively, operated based on the respective timing signals outputted from the timing generator 15.

Figure 2:
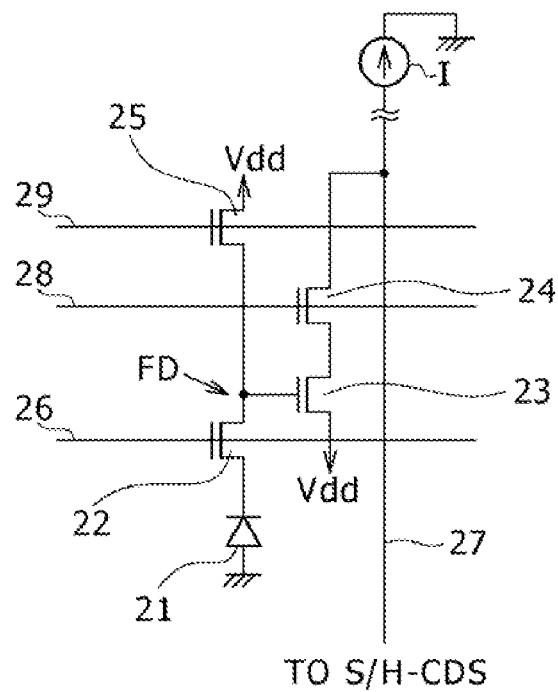
FIG. 2 is a circuit diagram showing an example of a circuit construction of a unit pixel of a CMOS image sensor pixel unit.

FIG. 2 is a circuit diagram showing an example of a circuit arrangement for a unit pixel of the pixel portion 11.

The unit pixel has, for example, a photodiode 21 as a photoelectric conversion element. The unit pixel also has, for its one photodiode 21, four transistors including a transfer transistor 22, an amplification transistor 23, an address transistor 24 and a reset transistor 25 as active elements.

The photodiode 21 enables incident light to be photoelectrically converted into charges (electrons herein) in an amount corresponding to the light quantity.

The transfer transistor 22 is connected between the photodiode 21 and a floating diffusion FD, and the electrons photoelectrically converted at the photodiode 21 are transferred to the floating diffusion FD when a drive signal is fed to a gate (transfer gate) of the transfer transistor 22 through a drive wiring 26. The floating diffusion FD is connected with a gate of the amplification transistor 23.

The amplification transistor 23 is connected to a vertical signal line 27 via the address transistor 24 and constitutes a source follower along with a constant current source I located outside the pixel unit. An address signal is fed to a gate of the address transistor 24 via a drive wiring 28. When the address transistor 24 is turned on, the amplification transistor 23 acts to amplify the potential of the floating diffusion FD and outputs a voltage corresponding to the potential to a vertical signal line 27. The voltage outputted from each pixel is outputted to the S/H-CDS circuit 13 via the vertical signal line 27.

The reset transistor 25 is connected between a power source Vdd and the floating diffusion FD and a reset signal is fed to its gate via a drive wiring 29, thereby resetting the potential of the floating diffusion FD to a potential of the power source Vdd.

These operations are simultaneously performed with respect to individual pixels of one row because the transfer transistor 22, address transistor 24 and reset transistor 25 are connected with each other at the respective gates thereof on a row-by-row basis.

FIG. 3 is a sectional view schematically showing a pixel structure of a CMOS image sensor of a backside illumination type.

The CMOS image sensor shown in the figure receives light from a second surface side opposite to a first surface side on which the wiring layer 38 has been formed.

The substrate 30 is made, for example, of an n-type silicon substrate and corresponds to a semiconductor substrate in the practice of the embodiment. The substrate 30 is formed thereon with a plurality of light-receiving portions 31 serving as unit pixels.

The light-receiving portion 31 corresponds to the photodiode 21 shown in FIG. 2. The light-receiving portion 31 is constituted of a pn junction in the substrate 30. The substrate 30 is formed by thinning a silicon wafer so as to permit light to be passed from the back side. The thickness of the substrate 30 is in the range of 2 to 6 μm for visible light and in the range of 6 to 10 μm for near-infrared ray although depending on the type of solid-state image sensing device.

The substrate 30 is formed, at the second surface side (backside or a light incident side) thereof, with a metallic light-shielding film 33 via an insulating film 32 made of silicon oxide. The metallic light-shielding film 33 has an opening 33a opened at a site of the light-receiving portion 31.

A protective film 34 made of silicon nitride is formed on the metallic light-shielding film 33. A color filter 35 capable of passing light alone within a desired wavelength range is formed on the protective film 34. A microlens 36 focusing incident light on the light-receiving portion 31 is formed on the color filter 35.

On the other hand, a number of transistors are formed at the first surface side of the substrate 30. Although not shown, the transistors 22 to 25 shown in FIG. 2 are formed at the pixel portion of the substrate 30. Further, although not particularly shown, a p-well and an n-well are formed at the peripheral circuit portion of the substrate 30 and a CMOS circuit is formed in these wells.

A wiring layer 38 including a multilayered metal wiring is formed over the first surface side (outer surface) of the substrate 30. A support substrate 39 is provided via an adhesive layer (not shown) on the wiring layer 38. The support substrate 39 is provided so as to reinforce the strength of the substrate 30. The support substrate 39 is made, for example, of a silicon substrate.

[Method of Making a Solid-State Image Sensing Device]

Next, a method of making a CMOS image sensor having such an arrangement as set out above is described. The procedure of making a pixel structure mainly of the CMOS image sensor is described hereinbelow.

FIGS. 4A to 4E are, respectively, a schematic sectional view showing an example of a procedure of making a key part of a pixel structure of a CMOS image sensor of a backside illumination type.

Figure 4A:
FIGS. 4A to 4E are, respectively, a schematic sectional view showing an example of a procedural step of making a key part of a pixel structure of a backside illumination type of CMOS image sensor.

For the manufacture of a pixel structure of a CMOS image sensor, a light-receiving portion 31 and a peripheral circuit 30a are initially formed in a substrate 30 as shown in FIG. 4A. The light-receiving portion 31 is formed, for example, by forming a plurality of pixels including photodiodes in a two-dimensional array at an image-sensing region of the substrate 30. The peripheral circuit 30a is formed, for example, by forming a logic circuit and the like made of a CMOS transistor.

Figure 4B:
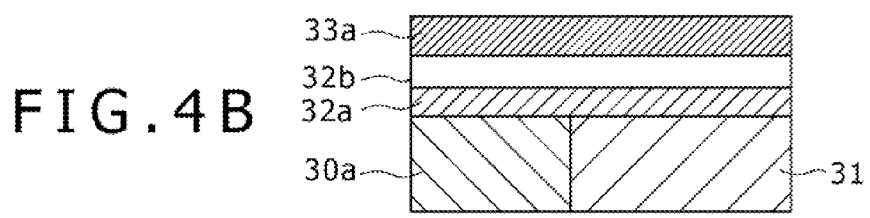

Next, as shown in FIG. 4B, a high-dielectric constant (high-K) $HfO_2$ film 32a is formed, as one sub-film of an insulating film 32, on the entire surfaces of the light-receiving portion 31 and the peripheral circuit 30a, for example, according to an ALD (atomic layer deposition) method. This $HfO_2$ film 32a has a refractive index of about 2.0 and enables an anti-reflecting effect to be obtained by appropriate control of its film thickness. The film thickness is favorably in the range, for example, of about 50 to 60 nm. When the $HfO_2$ film 32a is subjected to crystallization annealing, a negatively fixed charge is formed in the film. More particularly, the $HfO_2$ film 32a is formed as a film having a minus negative charge. It will be noted that in the course of the formation of the $HfO_2$ film 32a by the ALD method, an about 1 nm thick silicon oxide film (not shown) is formed at the interface with the surface of the substrate 30.

After the formation of the a $HfO_2$ film 32a, a $SiO_2$ film 32b is formed over the entire surface of the $HfO_2$ film 32a as another sub-film of the insulating film 32, for example, according to the ALD method. The formation of this $SiO_2$ film 32b does not permit the $HfO_2$ film 32a and a subsequently formed metallic light-shielding film 33 to directly contact with each other and thus prevents the reaction between the $HfO_2$ film 32a and the metallic light-shielding film 33 ascribed to the contact thereof. Simultaneously, when the metallic light-shielding film 33 is etched, it can be prevented to directly etch the surface of the $HfO_2$ film 32a.

It is to be noted that mention has been made herein of the case where the $HfO_2$ film 32a and the $SiO_2$ film 32b are formed as the insulating film 32 and are not always limited thereto, but they may be formed by use of other types of film-forming materials. In this regard, however, it is preferred that the insulating film 32 contains a film whose specific permittivity is not less than 5. As a film-forming material of high dielectric constant (high-K) that has a specific permittivity of not less than 5, mention is made of those materials containing at least one element of hafnium (Hf), zirconium (Zr), aluminum (Al), tantalum (Ta), titanium (Ti), yttrium (Y) and lanthanoide (Ln).

After the formation of the $HfO_2$ film 32a and $SiO_2$ film 32b serving as the insulating film 32, a metallic film 33a serving as a metallic light-shielding film 33 is formed on the entire surface of the $SiO_2$ film 32b. A material for the metallic film 33a includes tungsten (W) having excellent light-shielding ability although not limitative. There may be used metallic films containing at least one element selected from among tungsten (W), aluminum (Al), titanium (Ti), copper (Cu) and tantalum (Ta), or laminated films thereof. When using such film-forming materials, there may appreciably arise a problem of dark current at a portion beneath the metallic light-shielding film 33 although depending on the light-shielding ability thereof. In that case, the problem of the dark current can be overcome through an annealing treatment described hereinafter.

Figure 4C:
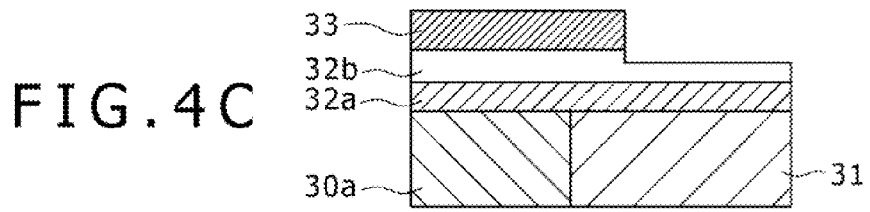

Thereafter, as shown in FIG. 4C, the metallic film 33a is subjected, for example, to etching so that the metallic film 33a is selectively removed so as to cover a partial region over the light-receiving portion 31 and the entire region over the peripheral circuit 30a.

The coverage of the partial region over the light-receiving portion 31 is to determine a black level of image based on the output from the light-receiving portion 31 by creating a region where no light enters the light-receiving portion 31. The coverage of the entire region over the peripheral circuit 30a is to suppress a characteristic variation depending on the light entering the peripheral circuit 30a.

The metallic film 33a obtained after the selective removal serves as a metallic light-shielding film 33 partly covering the insulating film 32 in correspondence to the light-receiving portion 31. The term "in correspondence to" the light-receiving portion 31 means that the metallic light-shielding film 33 is patterned correspondingly to a formed pattern of the light-receiving portion 31. In this regard, however, it is not necessary that both patterns be in complete coincidence with each other and that the case where the metallic light-shielding film 33 covers a partial region over the light-receiving portion 31 as set forth above is encompassed within the category where both patterns are "in correspondence with" each other. In addition, the term "partial" means not to cover the entire surface over the insulating film 32.

Figure 4D:
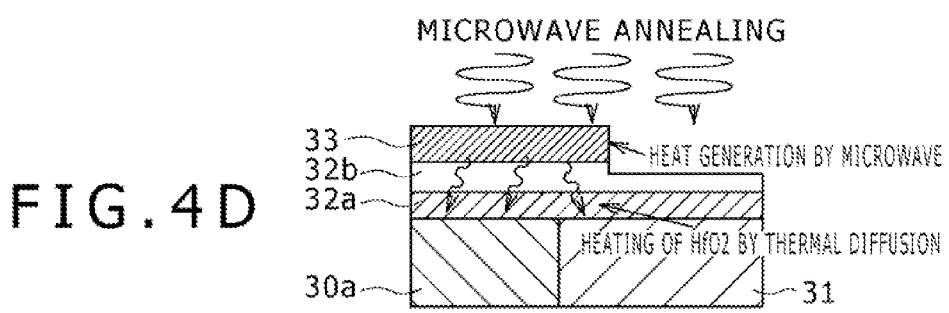

As shown in FIG. 4D, after the formation of the metallic light-shielding film 33, a microwave is irradiated against the metallic light-shielding film 33. The irradiation of the microwave causes heat to be generated from inside a forming material of the metallic light-shielding film 33 by the interaction between the microwave and the forming material. This is because charged particles and electric dipoles within the forming material of the metallic light-shielding film 33 rotate or oscillate by the influence of the oscillation and electromagnetic field induced by the microwave. In short, the metallic light-shielding film 33 is heated by the irradiation of the microwave.

When the metallic light-shielding film 33 is heated in this way, the heat of the metallic light-shielding film 33 is transmitted by thermal conduction to a portion beneath the metallic light-shielding film 33, or a laminated portion with the metallic light-shielding film 33 in or within the insulating film 32. More particularly, the laminated portion with the metallic light-shielding film 33 in the insulating film 32 is selectively annealed by using the metallic light-shielding film 33 as a heat source. The term "selectively" means that the annealing is not effected uniformly relative to the entire surface region over the insulating film 32, but is effected mainly at the laminated portion with the metallic light-shielding film 33.

The microwave for heating the metallic light-shielding film 33 is one whose frequency ranges, for example, from 300 MHz to 300 GHz.

The selective annealing of the insulating film 32 is carried out by controlling the microwave frequency and irradiation time in such a way that the treating temperature is in the range of 250° C. to 500° C., preferably not higher than 400° C. Such a temperature range ensures that portions other than the insulating film 32, such as the wiring layer 38, can be prevented from damage by the annealing.

As stated hereinabove, if a microwave is irradiated against the metallic light-shielding film 33 to anneal the insulating film 32, it is unnecessary that the heating temperature to be applied over the entire CMOS image sensor, or over the entire region over the insulating film 32 be made high. Selective annealing against the portion alone beneath the metallic light-shielding film 33 permits this portion to be changed in quality. This "beneath" portion is reinforced in pinning and improved in interfacial characteristics without surpassing the limit based on the thermal budget of the entire CMOS image sensor. Accordingly, even with the case where the metallic light-shielding film 33 partly covers the insulating film 32 therewith, generation of a dark current from the portion beneath the metallic light-shielding film 33, i.e. from a laminated portion with the metallic light-shielding film 33 in the insulating film 32, can be suppressed.

Figure 4E:
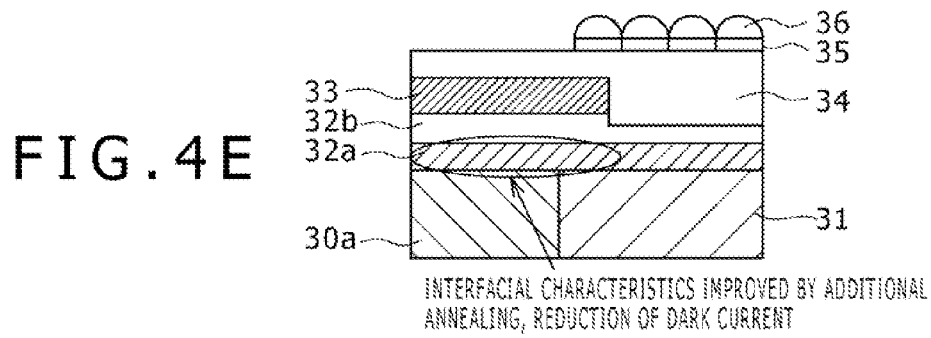

Thereafter, as shown in FIG. 4E, a protective film 34 is formed so as to flatten a step occurring upon formation of the metallic light-shielding film 33. This protective film 34 is formed, for example, by coating as an insulating film.

A color filter 35 is formed on the protective film 34 in the formed region of the light-receiving portion 31, on which an on-chip microlens 36 for focusing light is formed. In this way, a pixel structure of the CMOS image sensor of the backside illumination type having such an arrangement as shown in FIG. 3 is made.

<Second Embodiment>

Figure 5A:
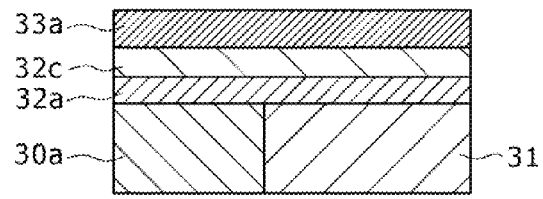
FIGS. 5A and 5B are, respectively, a schematic sectional view showing another example of a procedural step of making a key part of a pixel structure of a backside illumination type of CMOS image sensor.
Figure 5B:
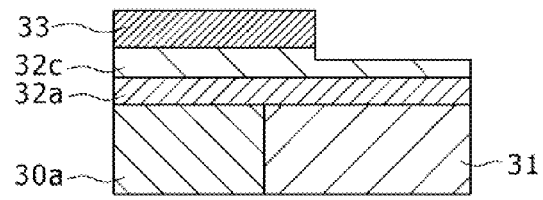
Figure 6:
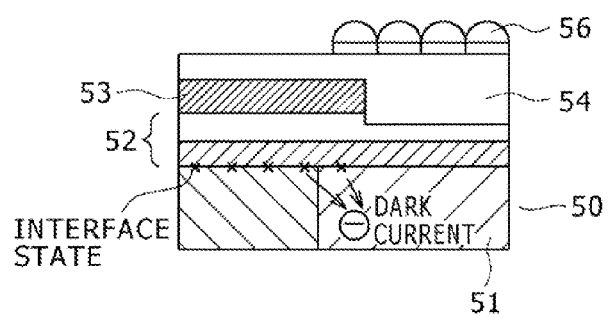
FIG. 6 is a schematic sectional view showing a construction example of a key part of a pixel structure of a backside illumination type of CMOS image sensor.

FIGS. 5A and 5B are, respectively, a schematic sectional view showing another example of a manufacturing procedure of a key part of a pixel structure of the CMOS image sensor of the backside illumination type.

It will be noted that illustration is made herein mainly of differences from the first embodiment.

As shown in FIG. 5A, according to the procedure illustrated herein, a $HfO_2$ film 32a is formed as one sub-film of an insulating film 32 over the entire surfaces of a light-receiving portion 31 and a peripheral circuit 30a, both formed in a substrate 30. The procedural steps before this formation are similar to those of the first embodiment.

After the formation of the $HfO_2$ film 32a, a silicon carbide (SiC) film 32c is formed over the entire surface of the $HfO_2$ film 32a as another sub-film of the insulating film 32, for example, by an ALD method. SiC that is a material for forming the SiC film 32c is one having the function as a microwave absorber. Accordingly, the SiC film 32c is one that is formed of a material having the function as a microwave absorber.

After the formation of the $HfO_2$ film 32a and SiC film 32c serving as the insulating film 32, a metallic film 33a acting as a metallic light-shielding film 33 is formed over the entire surface of the SiC film 32c. The formation of the metallic film 33a is made in the same manner as in the first embodiment.

Thereafter, as shown in FIG. 5B, the metallic film 33a is subjected, for example, to etching for selective removal in such a way that the metallic film 33a covers a partial region over the light-receiving portion 31 and the entire region over the peripheral circuit 30a. This selective removal is carried out in the same manner as in the first embodiment. This enables the metallic light-shielding film 33 to be formed as partly covering over the insulating film 32 in correspondence to the light-receiving portion 31.

After having formed the metallic light-shielding film 33 in this way, a microwave is irradiated in a manner as illustrated in the first embodiment.

At this stage, the SiC film 32c is disposed at the lower layer side of the metallic light-shielding film 33. This SiC film 32c has the function as a microwave absorber.

Accordingly, when a microwave is irradiated, the microwave is absorbed in, aside from the metallic light-shielding film 33, the SiC film 32c and thus both metallic light-shielding film 33 and SiC film 32c are heated.

When the metallic light-shielding film 33 is heated by the microwave irradiation under conditions where the metallic light-shielding film 33 partly covers the insulating film 32 therewith, a portion alone beneath the metallic light-shielding film 33 is selectively annealed, thereby enabling the portion to be changed in quality.

Additionally, when the SiC film 32c is heated, in addition to the metallic light-shielding film 33, by the microwave irradiation, the $HfO_2$ film 32a at a portion beneath the metallic light-shielding film 33 can be efficiently heated along with the $HfO_2$ film 32a being also heated at portions other than the portion beneath the metallic light-shielding film 33. In other words, the $HfO_2$ film 32a at a portion above (i.e. an effective portion) the light-receiving portion 31 can also be heated. As a result, the light-shielded portion of the metallic light-shielding film 33 and the effective portion not shielded with the metallic light-shielding film 33 are, respectively, improved in interfacial characteristics in the $HfO_2$ film 32a. Thus, generation or springing of a dark current from the $HfO_2$ film 32a can be suppressed or inhibited.

In the first and second embodiments set forth above, preferred embodiments of the invention are described, to which the invention should not be construed as limited.

For example, the values or materials used in the above embodiments are examples and the present invention is not limited thereto.

For instance, examples of the CMOS image sensors of the backside illumination type have been illustrated in the embodiments and the invention is not limited thereto, but is applicable to other types of solid-state image sensing devices.

Hence, the invention should not be construed as being limited to those illustrated in the embodiments and many alterations and variations may be possible without departing from the spirit of the invention.

The present application contains subject matter related to that disclosed in Japanese Priority Patent Application JP 2009-128438 filed in the Japan Patent Office on May 28, 2009, the entire content of which is hereby incorporated by reference.

It should be understood by those skilled in the art that various modifications, combinations, sub-combinations and alternations may occur depending on design requirements and other factors insofar as they are within the scope of the appended claims or the equivalent thereof.

What is claimed is:

1. A method for making a semiconductor device comprising:
   providing a semiconductor substrate having a light receiving side having a light-receiving portion for carrying out photoelectric conversion and a peripheral circuit portion;
   forming an insulating film over said light-receiving side of said semiconductor substrate, including said light-receiving portion and said peripheral circuit portion;
   forming a metallic light-shielding film over said insulating film and at least over said peripheral circuit portion; and
   annealing said insulating film at least over said peripheral circuit portion using microwave irradiation.

2. The method of claim 1, wherein said metallic light-shielding film contains at least one element of tungsten, aluminum, titanium, copper and tantalum, or a laminated film thereof.

3. The method of claim 1, wherein annealing is carried out at a temperature ranging from 250° C. to 500° C.

4. The method of claim 1, wherein said insulating film includes a material that functions as a microwave absorber.

5. The method of claim 4, wherein said material is a silicon carbide (SiC).

6. The method of claim 1, comprising forming a wiring layer on a side of said semiconductor substrate opposite said light receiving side,
   wherein,
      said semiconductor device is a solid-state image sensing device.

7. The method of claim 1, wherein forming said metallic light-shielding film includes forming said metallic-shielding film over said insulating film over a portion of said light-receiving portion.

8. The method of claim 7, wherein annealing said insulating film includes annealing said insulating film also over said portion of said light-receiving portion.

9. The method of claim 8, wherein using said microwave irradiation includes irradiating said metallic light-shielding film with a microwave.

10. The method of claim 1, wherein using said microwave irradiation includes irradiating said metallic light-shielding film with a microwave.

11. The method of claim 1, wherein said insulating film includes a material containing at least one element of hafnium (Hf), zirconium (Zr), aluminum (Al), tantalum (Ta), titanium (Ti), yttrium (Y), and lanthanoide (Ln).

12. The method of claim 1, wherein said insulating film includes a first insulating film facing said semiconductor substrate and a second insulating film facing said metallic light-shielding film.

13. The method of claim 12, wherein said first insulating film is formed of a material with a high dielectric constant (high-K).

14. The method of claim 12, wherein said first insulating film is formed of a material containing at least one element of hafnium (Hf), zirconium (Zr), aluminum (Al), tantalum (Ta), titanium (Ti), yttrium (Y), and lanthanoide (Ln).

15. The method of claim 12, wherein said second insulating film is formed of a material that functions as a microwave absorber.

16. The method of claim 15, wherein the material is a silicon carbide (SiC).

17. The method of claim 12, further comprising:
    performing crystallization annealing of said first insulating film.

18. The method of claim 1, wherein said insulating film is formed using an atomic layer deposition (ALD) method.

19. A method for making a semiconductor device comprising:
    providing a semiconductor substrate having a light receiving side having a light-receiving portion for carrying out photoelectric conversion and a peripheral circuit portion;
    covering said light-receiving side, including said light-receiving portion and said peripheral circuit portion, with an insulating film;
    forming a metallic light-shielding film over a portion of said insulating film; and
    heating said metallic light-shielding film by irradiating said metallic light-shielding film with a microwave so as to selectively anneal said portion of said insulating film beneath said metallic light-shielding film.

20. The method of claim 19, wherein said portion of said insulating material is that portion over all of said peripheral circuit portion.

21. The method of claim 19, wherein said portion of said insulating material includes that portion over all of said peripheral circuit portion and a portion over less than all of said light-receiving portion.

* * * * *